US010095566B2

(12) United States Patent
Hartmann et al.

(10) Patent No.: US 10,095,566 B2
(45) Date of Patent: Oct. 9, 2018

(54) DETECTING ACTIVATION OF AN OPERATOR CONTROL ELEMENT IN A MOTOR VEHICLE

(71) Applicant: AUDI AG, Ingolstadt (DE)

(72) Inventors: Jürgen Hartmann, Gutenstetten (DE); Patrick Sassmannshausen, Böhmfeld (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/565,630

(22) PCT Filed: Apr. 8, 2016

(86) PCT No.: PCT/EP2016/000579
§ 371 (c)(1),
(2) Date: Oct. 10, 2017

(87) PCT Pub. No.: WO2016/165818
PCT Pub. Date: Oct. 20, 2016

(65) Prior Publication Data
US 2018/0074880 A1 Mar. 15, 2018

(30) Foreign Application Priority Data

Apr. 11, 2015 (DE) .................. 10 2015 004 694

(51) Int. Cl.
*G06F 11/07* (2006.01)
*B60K 37/06* (2006.01)
(Continued)

(52) U.S. Cl.
CPC .......... *G06F 11/0739* (2013.01); *B60K 37/06* (2013.01); *H03K 5/1254* (2013.01); *H03K 17/16* (2013.01); *B60K 2350/1024* (2013.01)

(58) Field of Classification Search
CPC .... G60F 11/07; B60T 8/17555; B60W 30/16; B60K 23/0808; G01L 1/18; G07C 9/00309; H02H 7/0851; H03K 5/24
(Continued)

(56) References Cited

U.S. PATENT DOCUMENTS 4,868,412 A * 9/1989 Owens ................... G05B 11/14
307/141
4,961,476 A * 10/1990 Witte ................. B60K 23/0808
180/197
(Continued)

FOREIGN PATENT DOCUMENTS

CN 201444347 4/2010
DE 44 32 955 A1 3/1995
(Continued)

OTHER PUBLICATIONS

English translation of the International Preliminary Report on Patentability dated Oct. 26, 2017 from International Patent Application No. PCT/EP2016/000579, 6 pages.
(Continued)

*Primary Examiner* — Anne M Antonucci
*Assistant Examiner* — Sanjeev Malhotra
(74) *Attorney, Agent, or Firm* — Staas & Halsey LLP

(57) ABSTRACT

An operator control element in a motor vehicle generates an activation signal as a function of the activation of the operating element, and a control unit receives the activation signal and measures a signal length of the activation signal, and signals the activation if the signal length becomes greater than a predetermined debounce time. Despite possible incorrect triggering of the activation signal owing to voltage fluctuations, the debounce time is to be short. The control unit determines for this purpose an operating parameter, and on the basis of the operating parameter it is detected
(Continued)

that a supply voltage, made available at the control unit, satisfies a predetermined instability criterion, and when the instability criterion is satisfied the control unit delays the measurement of the signal length for a predetermined blocking time.

19 Claims, 2 Drawing Sheets

(51) Int. Cl.
*H03K 5/1254* (2006.01)
*H03K 17/16* (2006.01)

(58) Field of Classification Search
USPC ............ 701/93; 700/28; 340/5.72, 436, 438; 303/146; 307/141; 73/774; 318/127; 180/197; 474/135; 324/76.24; 123/352
See application file for complete search history.

(56) References Cited

U.S. PATENT DOCUMENTS

| | | | |
|---|---|---|---|
| 5,400,341 | A | 3/1995 | Makino et al. |
| 5,587,896 | A * | 12/1996 | Hansen ................ G05B 13/045 700/28 |
| 6,412,470 | B1 * | 7/2002 | Denz ...................... F02D 41/22 123/352 |
| 2002/0177935 | A1 * | 11/2002 | Winner .............. B60K 31/0008 701/93 |
| 2006/0119474 | A1 * | 6/2006 | Requejo ................... B60Q 9/00 340/438 |
| 2006/0273657 | A1 * | 12/2006 | Wanke ................ B60T 8/17555 303/146 |
| 2007/0040546 | A1 * | 2/2007 | Courtel .................... H03K 5/24 324/76.24 |
| 2008/0272898 | A1 * | 11/2008 | Irion ...................... B60Q 9/008 340/436 |
| 2010/0113201 | A1 * | 5/2010 | Lannutti ............... F16H 7/1218 474/135 |
| 2010/0320833 | A1 * | 12/2010 | Batistic ............... B60T 8/17555 303/146 |
| 2011/0248844 | A1 * | 10/2011 | Elias ....................... E05B 77/28 340/438 |
| 2011/0291799 | A1 * | 12/2011 | Girard, III ......... G07C 9/00309 340/5.72 |
| 2012/0032618 | A1 * | 2/2012 | Stoger .................. H02H 7/0851 318/127 |
| 2015/0040677 | A1 * | 2/2015 | Hammerschmidt ...... G01L 1/18 73/774 |
| 2017/0015349 | A1 * | 1/2017 | Bourdrez ............. B62D 5/0481 |

FOREIGN PATENT DOCUMENTS

| | | |
|---|---|---|
| DE | 100 09 770 | 11/2004 |
| DE | 103 29 196 | 1/2005 |
| DE | 10 2005 039 392 A1 | 2/2007 |
| DE | 10 2011 085 437 A1 | 5/2013 |
| DE | 10 2015 004 694.2 | 4/2015 |
| JP | 9-258853 | 10/1997 |
| WO | PCT/EP2016/000579 | 4/2016 |

OTHER PUBLICATIONS

International Search Report dated Jul. 12, 2016 from International Patent Application No. PCT/EP2016/000579, 2 pages.
German Office Action dated Feb. 26, 2016 from German Patent Application No. 10 2015 004 694.2, 6 pages.
Chinese Office Action dated Jul. 5, 2018 from Chinese Patent Application No. 201680027183.3, 5 pages.

* cited by examiner

DETECTING ACTIVATION OF AN OPERATOR CONTROL ELEMENT IN A MOTOR VEHICLE

CROSS REFERENCE TO RELATED APPLICATIONS

This application is a U.S. national stage of International Application No. PCT/EP2016/000579, filed on Apr. 8, 2016. The International Application claims the priority benefit of German Application No. 10 2015 004 694.2 filed on Apr. 11, 2015. Both the International Application and the German Application are incorporated by reference herein in their entirety.

BACKGROUND

Described herein is a method for detecting activation of an operator control element in a motor vehicle. Also described herein is a control device and a motor vehicle having the control device.

The operator control element may be a pushbutton, for example. If such an operator control element is activated by a user of the motor vehicle, this can activate a vehicle function, that is to say can initiate an action. The pushbutton signal is read in and evaluated by a control device for the purpose of detecting the activation. So-called ground switches are often used in operator control elements, that is to say a signal input of the control device is electrically connected or short-circuited to a ground potential when the operator control element is activated. If the control device detects a voltage dip at the signal input, that is to say a voltage value less than a predetermined threshold value is at the control input, the control device identifies the operator control element as activated.

The disadvantage of this activation detection is that the control device is dependent on a stable temporal profile of a supply voltage for the control device and for the operator control element. However, an unstable supply voltage may arise in a motor vehicle, that is to say the supply voltage may fall to a value less than a predetermined nominal value irrespective of activation of the operator control element, which then also results in a decrease in the voltage at the signal input of the control device. For example, the disconnection and connection of the vehicle battery may cause a high degree of ripple in the vehicle electrical system, that is to say voltage fluctuations of the supply voltage. This may result in the voltage at the signal input of the control device dipping greatly. The control device would then incorrectly detect activation of the operator control element.

Brief voltage fluctuations are generally already prevented by the debounce time, that is to say the activation signal from the operator control element must be applied to the signal input of the control device for a predetermined minimum signal duration, namely the debounce time, before the control device actually signals the activation. The debounce time therefore specifies for how long the activation signal must at least be applied before the control device signals the activation. The more robust the signal input is intended to be, the greater the selected debounce time. In order to also compensate for voltage fluctuations which arise when disconnecting or connecting the battery or when operating the electrical starter for an internal combustion engine of the motor vehicle, an undesirably high debounce time must be set. Although the system is then safe from such voltage fluctuations, the reaction time becomes large as a result. If the user of the motor vehicle activates the operator control element for a very short time, for example taps on a pushbutton for an excessively short time, activation is not detected because the debounce time has not yet expired before the activation signal has ended again.

German Patent Application No. 44 32 955 A1 describes a method for operating an electromotive window winder. In the event of a reset, that is to say the switching-on of the electrical voltage again after a voltage failure, the normal operation is restored only when the single pushbutton for operating the window winder has been activated at least three times.

German Patent Application No. 10 2005 039 392 A1 describes a method for safeguarding system variables. If the control device is reset, a warning message is generated as a result of the imminent reset being detected and the system variables are read from a volatile memory and stored in a non-volatile memory upon receipt of the warning message.

German Patent Application No. 10 2011 085 437 A1 describes a circuit arrangement which is used to evaluate a variable, which represents a voltage, to the effect that undershooting of a predetermined voltage threshold value is detected.

SUMMARY

Described herein is a method that compensates for the fluctuations in the supply voltage which are possible in a motor vehicle to the effect that the activation of an operator control element can be detected with a short debounce time during operation of the motor vehicle.

Described herein is a method for detecting activation of an operator control element in a motor vehicle. The operator control element may be a mechanical operator control element, for example a pushbutton. The operator control element generates an activation signal on the basis of the activation by a user. The activation signal is therefore only present while the operator control element is actually being activated. A control device receives the activation signal at a signal input. The control device also measures a signal duration of the activation signal and signals the activation if the signal duration becomes greater than a predetermined debounce time.

In order to be able to set the debounce time to a debounce time value for which there is no dependence on compensating for a voltage dip by virtue of the debounce time, the method described herein now provides the following development. The control device determines an operating parameter and, on the basis of the operating parameter, detects that a supply voltage for the motor vehicle made available to the control device satisfies a predetermined instability criterion. In other words, the control device checks, on the basis of the operating parameter, whether the supply voltage has fallen below a predetermined minimum value in the past. The term "past" should be understood as meaning, in particular, the last 1000 milliseconds or 500 milliseconds. If the instability criterion is satisfied, that is to say if the supply voltage had fallen below the minimum value, the measurement of the signal duration is delayed for a predetermined blocking time. In other words, the activation signal is initially not evaluated at all after detecting the instability, that is to say if the satisfied instability criterion has been detected, until the blocking time is past. For example, the activation signal can simply be ignored for the duration of the blocking time at a signal input of the control device. If the instability criterion is satisfied, the blocking time therefore has a blocking time value of greater than 0. In contrast, if the instability criterion is not satisfied, that is to say the blocking time criterion is violated, the blocking time value is equal to 0, that is to say the signal duration is measured after receiving the activation signal.

The method described herein results in the advantage that, if the supply voltage is stable and if the instability criterion is violated, only the debounce time is taken as a basis, which debounce time can also be set to a debounce time value optimized for operation irrespective of the stability of the supply voltage. In order to compensate for an instability in the supply voltage, the blocking time is used depending on the situation. As a result, the debounce time and the instability in the supply voltage are decoupled from one another.

The method described herein also includes developments whose features result in additional advantages.

In a simple embodiment, the operating parameter may be provided, for example, by an energy management device of the vehicle electrical system of the motor vehicle. Such an energy management device can measure, for example, a temporal profile of a magnitude of the supply voltage and can signal when a predetermined threshold value is undershot.

One development even compensates for a particularly large voltage dip which triggers a reset of the control device. The control device restarts after the reset. In the development, description data relating to the restart are determined as an operating parameter during the restart of the control device. The instability criterion accordingly comprises the fact that the description data signal the restart. In other words, the blocking time is always set to a blocking time value of greater than 0 when the control device restarts.

In this case, one development advantageously distinguishes between the events which can cause a restart. In this development, a first blocking time value is set for the situation in which the description data indicate a watchdog reset. A watchdog reset or program-controlled reset is triggered by a monitoring device which is also referred to as a watchdog. A second blocking time value which is greater than the first blocking time value is set for the situation in which the description data indicate a hard reset (reset caused by circuitry) caused by a lack of voltage. Since the hard reset is caused by a lack of voltage, it is highly likely that the supply voltage will not yet have fully reached its nominal value during the restart, but rather the voltage value will be less than the nominal value. In contrast, in the case of a watchdog reset or watchdog reset, the evaluation of the operator control element is blocked only for a shorter time because no voltage fluctuations can be expected in the motor vehicle in this case.

According to one development, the first blocking time value is in a range of 20 milliseconds to 70 milliseconds. According to one development, the second blocking time value is in a range of 100 milliseconds to 1 second. This makes it possible to reliably bridge a voltage instability in the case of a hard reset, as can typically occur in motor vehicles. As a result of the first blocking time value, the operator control element can be evaluated with a shorter delay during the restart.

During normal operation with a stable supply voltage, a debounce time value of the debounce time is set in a range of 20 milliseconds to 100 milliseconds according to one development. Such a debounce time value is advantageously suitable for compensating for voltage fluctuations, as can occur during operation of the motor vehicle if the motor vehicle is moving, for example, and nevertheless enables a sufficiently fast reaction to activation of the operator control element.

According to one development, the operator control element generates the activation signal by virtue of a signal input of the control device being short-circuited to a ground potential of the motor vehicle as a result of the operator control element being activated. As a result, the operator control element can be configured in a particularly cost-effective and low-complexity manner.

Also described herein is a control device for detecting activation of an operator control element. The control device has the described signal input for receiving the activation signal from the operator control element. A control apparatus is designed to measure a signal duration of the activation element and to signal the activation if the signal duration becomes greater than a predetermined debounce time. The control apparatus may be provided, for example, on the basis of a microcontroller or microprocessor of the control device. The control device is also designed to determine an operating parameter and, on the basis of the operating parameter, to detect that a supply voltage for the control device satisfies a predetermined instability criterion. One of the operating parameters already described may be taken as a basis as the operating parameter.

If the instability criterion is satisfied, the control device delays the measurement of the signal duration for a predetermined blocking time.

The control device described herein can also implement the features which have already been described in connection with the developments of the method. For this reason, the corresponding developments of the control device are not described again here.

Also described herein is a motor vehicle having an operator control element and an embodiment of the control device as described herein, the operator control element being electrically connected to the signal input of the control device. In the motor vehicle, the operator control element can be evaluated with a short debounce time without resulting in false detection of the activation, that is to say a false alarm, on account of an unstable supply voltage for the motor vehicle.

According to one development of the motor vehicle, the operator control element is designed to short-circuit the signal input of the control device to a ground potential in order to generate the activation signal.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Figure 1:
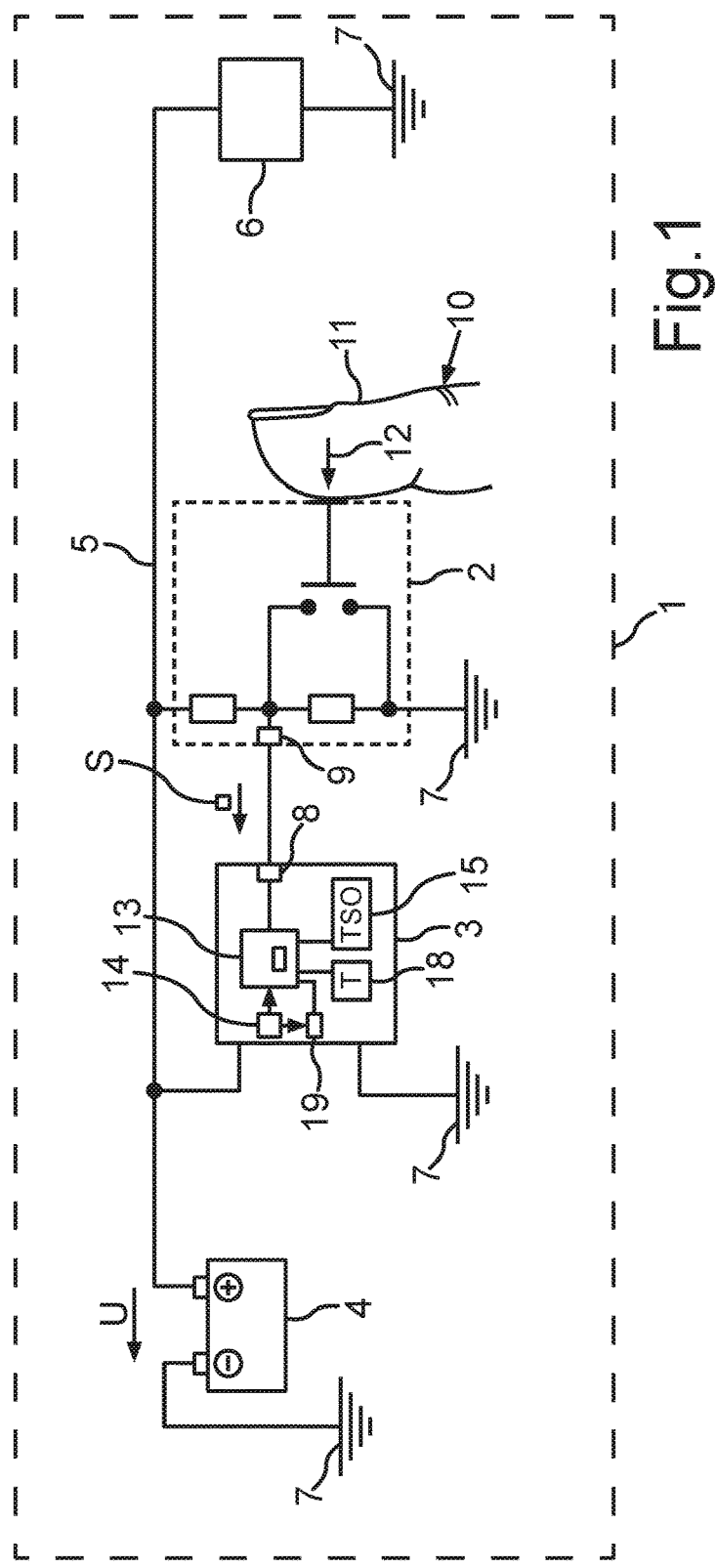
FIG. 1 is a schematic illustration of an embodiment of the motor vehicle described herein.

Reference will now be made in detail to the preferred embodiments, examples of which are illustrated in the accompanying drawings, wherein like reference numerals refer to like elements throughout.

Exemplary embodiments are explained below with reference to the drawings. In the exemplary embodiments, the described components of the embodiments are each individual features which can be considered independently of one another and each also develop the disclosure independently of one another and can therefore also be considered individually or in a combination other than the combination shown. Furthermore, the described embodiments can also be supplemented with further features which have already been described.

In the drawings, functionally identical elements are each provided with the same reference symbols.

FIG. 1 shows a motor vehicle 1 which may be, for example, an automobile, in particular a passenger automobile. An operator control element 2, a control device 3, a voltage source 4, an electrical vehicle electrical system line 5, an electrical load 6 and a ground potential 7 are illustrated. The operator control element 2 may be, for example, in the form of a pushbutton which may be arranged, for example, in a vehicle interior, for example in a dashboard. The control device 3 has a control input 8 to which a signal output 9 of the operator control element 2 is connected. The voltage source 4 can supply, for example, a vehicle battery and/or a generator of the motor vehicle. The voltage source 4 generates a supply voltage U which is provided via the vehicle electrical system line 5 in the motor vehicle 1. The electrical load 6 may be connected to the vehicle electrical system line 5. The electrical load 6 may be, for example, an electrical starter of the motor vehicle 1. Circuits which are formed by the vehicle electrical system line 5 can be connected via the ground potential 7. The ground potential 7 may be formed, for example, by a ground line and/or electrically conductive components of the motor vehicle, for example a vehicle frame.

The operator control element 2 and the control device 3 may likewise be connected to the vehicle electrical system line 5 in order to receive the supply voltage U. The operator control element 2 may be operated by a user 10. For example, a user 10 can activate 12 the operator control element 2 using his finger 11, for example can activate or press a button of the operator control element 2 using his finger 11. The operator control element 2 may be designed to short-circuit the signal output 9 to the ground potential 7 upon activation 12, with the result that the signal input 8 of the control device 3 is also electrically connected or short-circuited to the ground potential 6. This is an activation signal S which is transmitted from the signal output 9 to the signal input 8. In order to detect the control signal S, the control device 3 may have a control apparatus 13 which may be a microcontroller or microprocessor, for example.

The supply voltage U from the voltage source 4 may fluctuate. For example, during operation of the load 6, the supply voltage U may fall below a nominal value U0 which may be 12 volts or 48 volts, for example. While the operator control element 3 is not activated, the electrical voltage detected at the signal input 8 by the control device 3 also falls, with the result that the activation signal S is incorrectly detected at the signal input 8 in the case of an excessively low electrical voltage.

Furthermore, the falling of the supply voltage U below a reset threshold value of the control apparatus 13 may trigger a reset, after which the control apparatus 13 carries out a restart. In other words, the control device 3 restarts. Such a voltage fluctuation may occur, for example, when disconnecting or connecting the vehicle electrical system line 5 to the voltage source 4.

However, a reset of the control apparatus 13 may also be triggered by a watchdog device or monitoring device 14, that is to say when the supply voltage U is stable. The monitoring device 14 can trigger the reset, for example, if it is detected that, as a result of a program error, the control apparatus 13 repeatedly carries out the same instructions in an endless loop, for example, and the signal input 8 is no longer monitored as a result.

Figure 2:
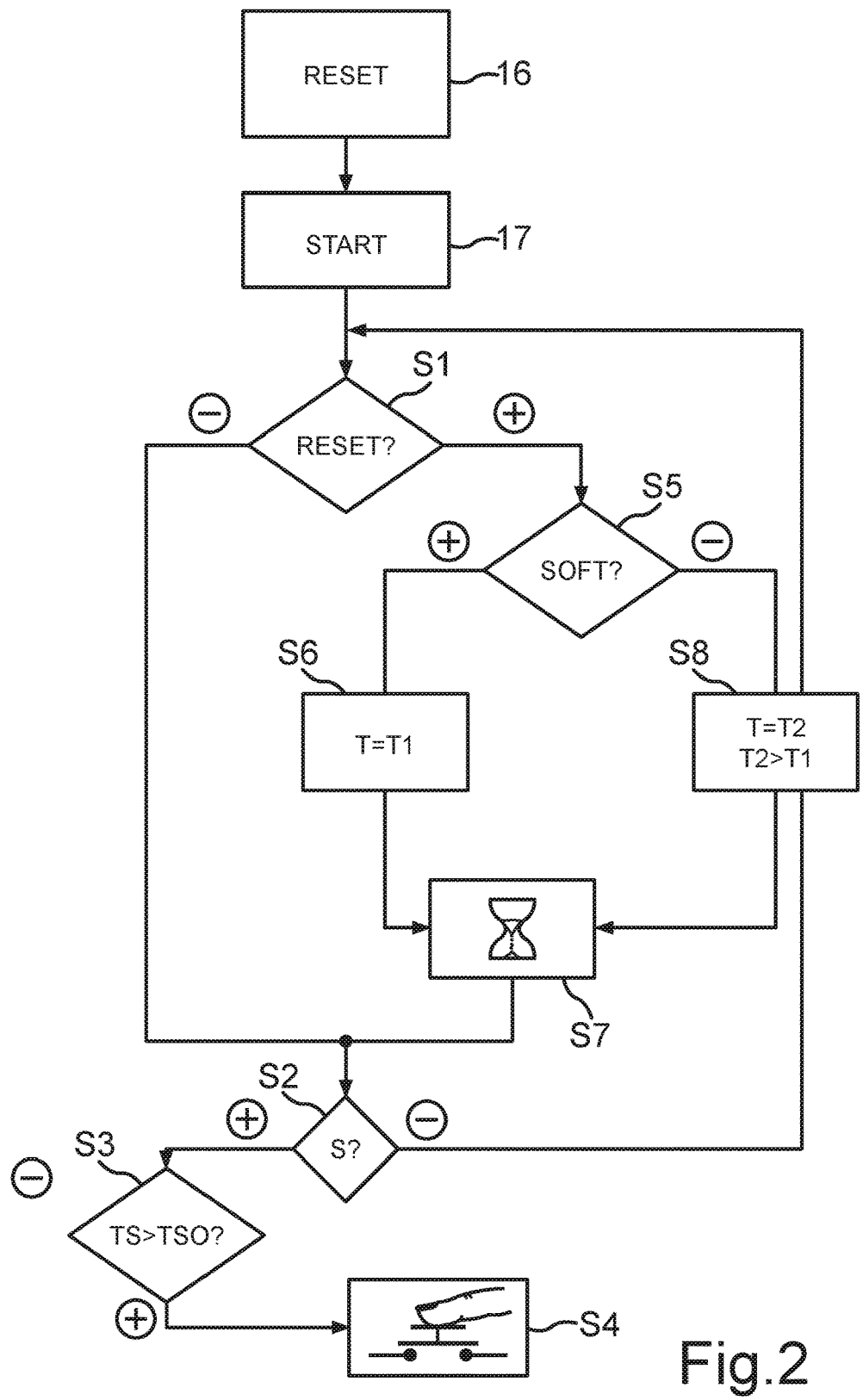
FIG. 2 is a flowchart for an embodiment of the method described herein.

In order to reliably detect the activation 12 with a predetermined debounce time 15 (TSO0) despite the described voltage fluctuations and therefore despite the influences on the operation of the control device 3, the control apparatus 13 can carry out the method described below according to FIG. 2.

By using the method, the control apparatus 13 compensates for the influence of a fall or voltage dip in the supply voltage U which caused a reset of the control apparatus 13. In contrast, no unnecessary delay in the detection of the activation 12 is caused in the case of a stable supply voltage U and a restart which was triggered by a watchdog reset of the monitoring device 14.

In order to explain the method of operation of the control apparatus 13, it is assumed that a reset 16 occurs for a reason which is initially unknown to the control apparatus 13, whereupon the control apparatus 13 carries out a restart 17 in the case of a sufficiently large supply voltage U (greater than the reset threshold value).

In operation S1, the control apparatus 13 checks whether it is currently carrying out a restart or the restart has already been concluded. If the restart has been concluded (symbolized in FIG. 2 by a minus sign "−"), the control apparatus 13 checks whether the activation signal 8 is applied to the signal input 8 in operation S2. If an activation signal S is not applied (minus sign "−"), a check is again carried out in operation S1 in order to determine whether the control apparatus 13 is currently in a restart. If the activation signal S is detected at the signal input 8 in operation S2 (plus sign "+"), a check is carried out in operation S3 in order to determine whether the activation signal S has been applied for longer than the debounce time 15 (TS0). For this purpose, a signal duration TS from the reception of the activation signal S is measured. If the signal duration TS becomes greater than the debounce time TS0 (plus sign "+"), the activation 12 of the operator control element 2 is signaled in operation S4. A vehicle function in the motor vehicle 1 can then be triggered, for example, on the basis of the signaling of the activation 12. For example, the operator control element 2 and the control device 3 may be part of an infotainment system of the motor vehicle 1. The activation of a telephone or a radio or a navigation device can then be carried out, for example, as the vehicle function. A confirmation button (OK button) or an arrow button can also be detected, for example, as a vehicle function and corresponding control can be carried out, for example, in an operating menu.

If, in operation S3, the signal duration TS is shorter than the debounce time TS0 and the activation signal S has ended (minus sign "−" in operation S3), the signal apparatus 13 again checks in operation S1 whether the control apparatus 13 is in the restart routine.

If it is detected in operation S1 that the restart is currently being carried out (plus sign "+"), a check is carried out in operation S5 in order to determine whether the restart 17 was triggered by a watchdog reset of the monitoring device 14. In the event of a watchdog reset (plus sign "+"), a blocking time 18 (T) is set to a first blocking time value T1 in operation S6. The evaluation of the signal input 8 is then blocked in operation S7, that is to say the control apparatus 13 waits for the blocking time T before a check is carried out in operation S2 in order to determine whether the activation signal S is present at the signal input 8.

If it is detected in operation S5 that a hard reset is carried out, rather than a watchdog reset, for example on account of the supply voltage U falling below the reset threshold value of 5 volts or 5.5 volts (minus sign "−"), for example, the blocking time T is set to a second blocking time value T2, which is greater than the first blocking time value T1, in operation S8. The evaluation of the signal input 8 is then delayed for the blocking time T in operation S7.

As a result of the method, the control device is robust with respect to a voltage fluctuation in the supply voltage U and has a quick reaction upon activation 12 of the operator control element 2 during normal operation with a stable supply voltage. In order to activate/evaluate the activation signal S, a debounce time which is in a range of 20 milliseconds to 100 milliseconds is set. As a result, the operating comfort is as high as in known control devices. Furthermore, the control device observes the ambient conditions by detecting whether a reset is present. The evaluation of the operator control element 2, that is to say the activation signal S, is blocked on the basis of two reset reasons.

For this purpose, it is monitored whether the control device is going through a reset (operation S1). In addition, it is evaluated what type of reset triggered the restart. The description data which are used for this purpose and indicate the cause (watchdog reset or hard reset) of the restart can be provided as operating parameters 19 in the control device 3. The provision of these description data is known per se from the related art.

Two reset reasons are assessed, namely whether a watchdog reset, for example a software reset, is present as reason 1 or whether a hard reset, for example as a result of the disconnection of the voltage source 4, is present as reason 2.

Depending on which reset reason is detected, the evaluation of the operator control element is blocked or is not blocked for a particular time. In the case of a watchdog reset, the evaluation of the pushbutton is blocked only for a very short time, for example for 30 milliseconds, because no voltage fluctuations can be expected in the vehicle in this case. The reset was specific to the control device and was not caused by a voltage fluctuation. In the case of a hard reset, the evaluation of the operator control element 2 is blocked for a longer time, for example for 100 milliseconds, because voltage fluctuations can be expected in the vehicle which may result in false triggering.

After the blocking time T, which may be 100 milliseconds for example, has expired, the operator control element 2 can be evaluated again with the debounce time which has been set. In this case, the debounce time which has been set may be very short, for example 40 milliseconds. As a result, the operating comfort and the reaction speed of the control device 3 during normal operation are very high, with the result that even very short activations 12 of the operator control element 2, in particular a pushbutton, can be detected.

Overall, the embodiments described herein provide a method for evaluating a pushbutton.

The system also includes permanent or removable storage, such as magnetic and optical discs, RAM, ROM, etc. on which the process and data structures can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV,* 358 F3d 870, 69 USPQ2d 1865 (Fed. Cir. 2004).

The invention claimed is:

1. A method for detecting activation of an operator control element in a motor vehicle, the method comprising:
    generating, by the operator control element an activation signal based on an activation of the operator control element;
    receiving, by a control device, the activation signal;
    determining, by the control device, an operating parameter;
    detecting, by the control device, whether a voltage for the motor vehicle supplied to the control device satisfies a predetermined instability criterion, based on the operating parameter;
    delaying measurement of a signal duration of the activation signal for a predetermined blocking time when the predetermined instability criterion is satisfied;
    measuring the signal duration of the activation signal after the predetermined blocking time expires when the predetermined instability criterion is satisfied or measuring the signal duration of the activation signal without delay when the predetermined instability criterion is not satisfied; and
    signaling the activation of the operator control element when the signal duration is greater than a predetermined debounce time.

2. The method as claimed in claim 1, further comprising determining description data relating to a restart of the control device as the operating parameter during the restart of the control device, and
    the predetermined instability criterion is satisfied when the description data indicates the restart of the control device.

3. The method as claimed in claim 2, further comprising:
    setting a first blocking time value when the description data indicates a watchdog reset of the control device was triggered by a monitoring device; and
    setting a second blocking time value, which is a greater duration than a duration of the first blocking time value when the description data indicates a hard reset of the control device was caused by a lack of voltage.

4. The method as claimed in claim 3, wherein
    the first blocking time value has a value between 20 milliseconds and 70 milliseconds, and
    the second blocking time value has a value between 100 milliseconds and 1 second.

5. The method as claimed in claim 1, wherein a debounce time value of the predetermined debounce time has a value between 20 milliseconds and 100 milliseconds.

6. The method as claimed in claim 1, wherein the generating the activation signal comprises short-circuiting a signal input of the control device to a ground potential of the motor vehicle in response to the operator control element being activated.

7. A control device for detecting activation of an operator control element, the control device comprising:
    a signal input configured to receive an activation signal generated by the operator control element; and
    at least one processor configured to:
        determine an operating parameter, detect whether a voltage supplied to the control device satisfies a predetermined instability criterion, based on the operating parameter, delay measurement of a signal duration of the activation signal for a predetermined blocking time when the predetermined instability criterion is satisfied, measure the signal duration of the activation signal after the predetermined blocking time expires when the predetermined instability criterion is satisfied or measure the signal duration of the activation signal without delay when the predetermined instability criterion is not satisfied, and signal the activation of the operator control element when the signal duration is greater than a predetermined debounce time.

8. The control device as claimed in claim 7, wherein the at least one processor is configured to receive description data which indicate a type of reset of the control device, and the description data corresponds to the operating parameter.

9. The control device as claimed in claim 8, further comprising a monitoring device configured to trigger a watchdog reset of the control device in response to a predefined condition, wherein the predetermined instability criterion is satisfied when the monitoring device triggers the reset of the control device, and the at least one processor is configured to set a first blocking time value when the description data indicates the watchdog reset of the control device was triggered by the monitoring device.

10. The control device as claimed in claim 9, wherein the at least one processor is configured to perform a hard reset of the control device when the voltage supplied to the control device is less than a threshold value, the predetermined instability criterion is satisfied when the voltage supplied to the control device is less than the threshold value, and the at least one processor is configured to set a second blocking time value when the description data indicates the hard reset of the control device was in response to the voltage supplied to the control device being less than the threshold value.

11. The control device as claimed in claim 10, wherein the first blocking time value has a value between 20 milliseconds and 70 milliseconds, and the second blocking time value has a value between 100 milliseconds and 1 second.

12. The control device as claimed in claim 7, wherein the control device is installed in a motor vehicle, and the signal input is short-circuited to a ground potential of the motor vehicle in response to the operator control element being activated to thereby generate the activation signal.

13. A motor vehicle, comprising:
an operator control element; and
a control device configured to detect activation of the operator control element, the control device including:
a signal input, electrically connected to the operator control element, configured to receive an activation signal generated by the operator control element, and
at least one processor configured to:
determine an operating parameter,
detect whether a voltage for the motor vehicle supplied to the at least one processor satisfies a predetermined instability criterion, based on the operating parameter, delay measurement of a signal duration of the activation signal for a predetermined blocking time when the predetermined instability criterion is satisfied, measure the signal duration of the activation signal after the predetermined blocking time expires when the predetermined instability criterion is satisfied or measure the signal duration of the activation signal without delay when the predetermined instability criterion is not satisfied, and signal the activation of the operator control element when the signal duration is greater than a predetermined debounce time.

14. The motor vehicle as claimed in claim 13, further comprising a ground potential, wherein the operator control element is configured to short-circuit the signal input of the control device to the ground potential to generate the activation signal.

15. The motor vehicle as claimed in claim 13, wherein the at least one processor is configured to receive description data which indicate a type of reset of the control device, and the description data corresponds to the operating parameter.

16. The motor vehicle as claimed in claim 15, wherein the control device further includes a monitoring device configured to trigger a watchdog reset of the control device in response to a predefined condition, the predetermined instability criterion is satisfied when the monitoring device triggers the reset of the control device, and the at least one processor is configured to set a first blocking time value when the description data indicates the watchdog reset of the control device was triggered by the monitoring device.

17. The motor vehicle as claimed in claim 16, further comprising a voltage source to supply the voltage to the control device, wherein the at least one processor is configured to perform a hard reset of the control device when the voltage supplied to the control device is less than a threshold value, the predetermined instability criterion is satisfied when the voltage supplied to the control device is less than the threshold value, and the at least one processor is configured to set a second blocking time value when the description data indicates the hard reset of the control device was in response to the voltage supplied to the control device being less than the threshold value.

18. The motor vehicle as claimed in claim 17, wherein the first blocking time value has a value between 20 milliseconds and 70 milliseconds, and the second blocking time value has a value between 100 milliseconds and 1 second.

19. The motor vehicle as claimed in claim 13, further comprising a vehicle system including at least one of an infotainment system, a navigation system, an audio system, and a communication system, wherein when the at least one processor signals the activation of the operator control system, a function of the vehicle system is executed.

* * * * *